(12) United States Patent
Wu et al.

(10) Patent No.: US 7,518,843 B2
(45) Date of Patent: Apr. 14, 2009

(54) ESD PROTECTION CIRCUIT WITH LOW PARASITIC CAPACITANCE

(75) Inventors: Yi-Hsun Wu, Hsin-Chu (TW);
Jian-Hsing Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 11/134,539

(22) Filed: May 19, 2005

(65) Prior Publication Data

US 2006/0215337 A1 Sep. 28, 2006

Related U.S. Application Data

(63) Continuation-in-part of application No. 11/091,131, filed on Mar. 28, 2005, now abandoned.

(51) Int. Cl.
*H02H 9/00* (2006.01)
*H02H 3/22* (2006.01)
(52) U.S. Cl. .................. 361/56; 361/54; 361/111
(58) Field of Classification Search ............... None
See application file for complete search history.

(56) References Cited

U.S. PATENT DOCUMENTS

| 6,066,879 A * | 5/2000 | Lee et al. ............... 257/355 |
| 6,249,414 B1 * | 6/2001 | Lee et al. ............... 361/111 |
| 6,385,028 B1 * | 5/2002 | Kouno .................. 361/111 |
| 6,576,934 B2 * | 6/2003 | Cheng et al. ............ 257/107 |
| 2003/0038298 A1 * | 2/2003 | Cheng et al. ............ 257/107 |

* cited by examiner

*Primary Examiner*—Stephen W Jackson
*Assistant Examiner*—Dharti H Patel
(74) *Attorney, Agent, or Firm*—K & E Gates LLP

(57) ABSTRACT

An ESD protection circuit includes a silicon controlled rectifier coupled between a circuit pad and ground for bypassing an ESD current from the circuit pad during an ESD event. An MOS transistor, having a source shared with the silicon controlled rectifier, is coupled between the pad and ground for reducing a trigger voltage of the silicon controlled rectifier during the ESD event. The silicon controlled rectifier has a first diode serially connected to a second diode in an opposite direction, between the pad and the shared source of the MOS transistor, for functioning as a bipolar transistor. In a layout view, a first area for placement of the first and second diodes is interposed between at least two separate sets of second areas for placement of the MOS transistor.

17 Claims, 4 Drawing Sheets

ESD PROTECTION CIRCUIT WITH LOW PARASITIC CAPACITANCE

This application is a Continuation-In-Part of U.S. patent application No. 11/091,131 filed Mar. 28, 2005 now abandoned entitled "ESD Protection Circuit with Low Parasitic Capacitance."

BACKGROUND

The present invention relates generally to integrated circuit (IC) designs, and more particularly to an electrostatic discharge (ESD) protection circuit that has a layout view, in which a various number of transistor areas can be selectively arranged to adjust the parasitic capacitance of the ESD protection circuit.

The gate oxide of a metal-oxide-semiconductor (MOS) transistor of an IC is most susceptible to damage. The gate oxide may be destroyed by being contacted with a voltage only a few volts higher than the supply voltage. It is understood that a regular supply voltage in an IC is 5.0, 3.3 volt or even lower. Electrostatic voltages from common environmental sources can easily reach thousands, or even tens of thousands of volts. Such voltages are destructive even though the charge and any resulting current are extremely small. For this reason, it is of critical importance to discharge any electrostatic charge, before it accumulates to a damaging voltage.

An ESD protection circuit is typically added to an IC at the bond pads. The bond pads are connections allowing the IC to connect to outside circuitries, electric power supplies, electric grounds, and electronic signals. Such added ESD protection circuit must allow a normal operation of the IC. This means that the protection circuit is effectively isolated from the normally operating core circuitry of the IC because it blocks a current flow, through itself, to ground or any other circuits or pads. In an operating IC, electric power is supplied to a VCC pad, electric ground is supplied to a VSS pad, electronic signals are supplied from outside to one or more pads, and electronic signals generated by the core circuitry of the IC are supplied to other pads for delivery to external circuits and devices. In an isolated, unconnected IC, all pads are considered to be electrically floating, or of indeterminate voltage.

ESD can arrive at any pad. This can happen, for example, when a person touches some of the pads on the IC. This is the same static electricity that may be painfully experienced by a person who walks across a carpet on a dry day and then touches a grounded metal object. In an isolated IC, ESD acts as a brief power supply for one or more pads, while the other pads remain floating, or grounded. Because the other pads are grounded, when ESD acts as a power supply at a randomly selected pad, the protection circuit acts differently than it does when the IC is operating normally. When an ESD event occurs, the protection circuit must quickly become conductive so that the electrostatic charge is conducted to VSS or ground, and is thus dissipated before it damages the core circuitry.

An ESD protection circuit, therefore, has two states: a normal operation mode and an ESD mode. When an IC is in the normal operation mode, the ESD protection circuit appears invisible to the IC by blocking current through itself and thus has no effect on the core circuitry. In the ESD mode, the ESD protection circuit serves its purpose of protecting the core circuit by conducting an electrostatic charge quickly to VSS, or ground.

It has been found that a four layer PNPN device called a silicon controlled rectifiers (SCR) can be one of the most effective devices in an ESD protection circuits in preventing the ESD damage. A SCR operates in two modes: a blocking mode and a latch-up mode. In the blocking mode, the SCR blocks a current flow therethrough, such that the ESD protection circuit has no effect on the core circuitry to be protected. Where there is a sufficient regeneration of current flow in the SCR, the latch-up condition is created. This enables a large current to flow through the SCR, and therefore, bypass an ESD current from the core circuitry during an ESD event.

It is understood that adding an NMOS transistor to the ESD protection circuit helps lower the trigger voltage for latching up the SCR. When doing so, the size of the NMOS transistor needs to be carefully designed. On the one hand, the NMOS transistor may turn on earlier than the SCR, if its size is large enough. On the other hand, the NMOS transistor may not effectively reduce the trigger voltage of the SCR, if its size is too small. The larger the size of the NMOS transistor, the greater the parasitic capacitance it provides. As a result, the greater the parasitic capacitance, the lower the trigger voltage of the SCR.

As such, what is needed is an ESD protection circuit that utilizes an SCR with an adjustable parasitic capacitance to reduce the trigger voltage of the same for a faster response to an ESD event.

SUMMARY

In view of the foregoing, this invention provides an ESD protection circuit with adjustable parasitic capacitance. In one embodiment, the ESD protection circuit includes a silicon controlled rectifier coupled between a circuit pad and ground for bypassing an ESD current from the circuit pad during an ESD event. An MOS transistor, having a source shared with the silicon controlled rectifier, is coupled between the pad and ground for reducing a trigger voltage of the silicon controlled rectifier during the ESD event. The silicon controlled rectifier has a first diode serially connected to a second diode in an opposite direction, between the pad and the shared source of the MOS transistor, for functioning as a bipolar transistor. In a layout view, a first area for placement of the first and second diodes is interposed between at least two separate sets of second areas for placement of the MOS transistor.

The construction and method of operation of the invention, however, together with additional objects and advantages thereof will be best understood from the following descriptions of specific embodiments when read in connection with the accompanying figures.

DESCRIPTION

Figure 1:
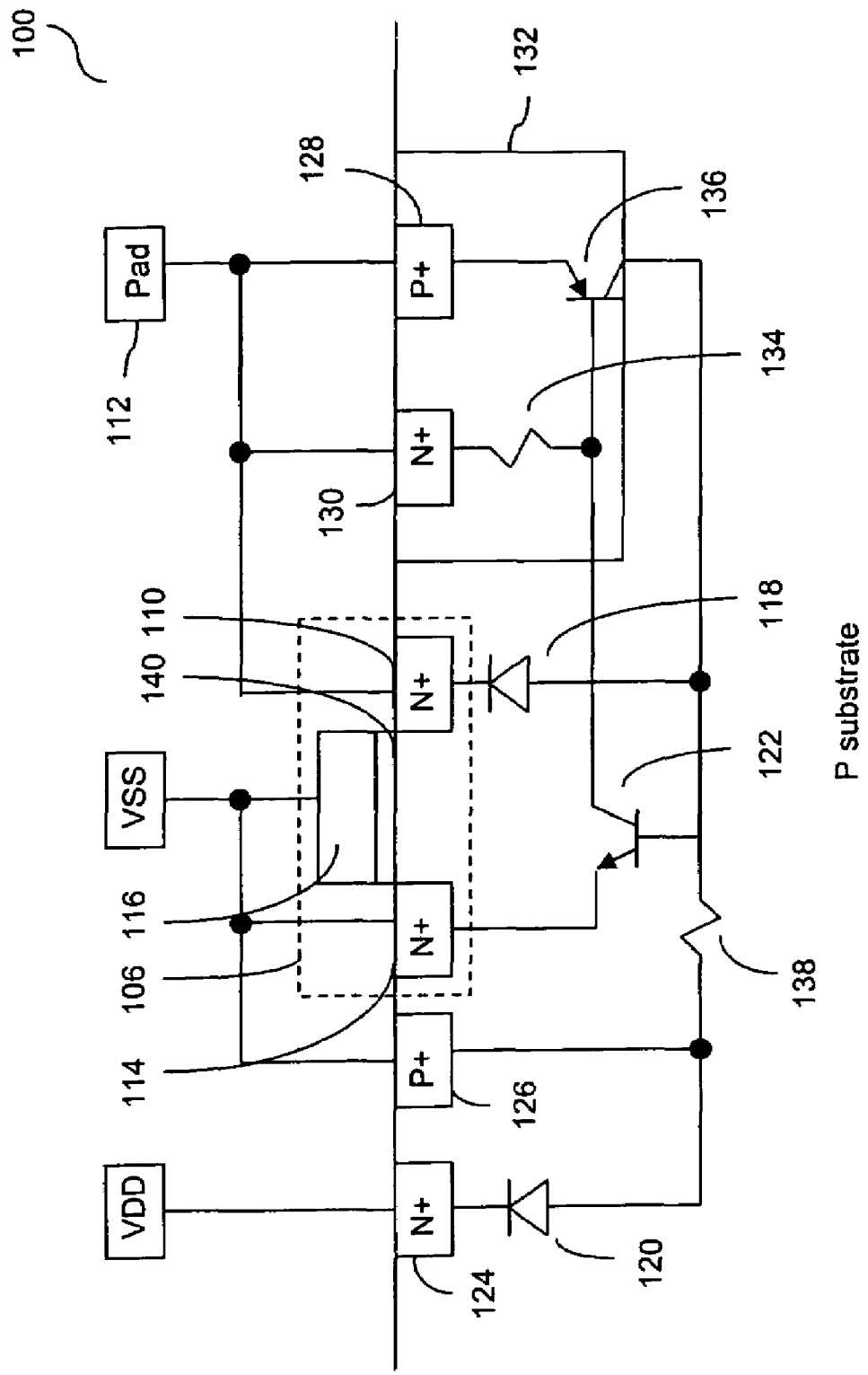
FIG. 1 illustrates a cross-sectional view of an ESD protection circuit, in accordance with one embodiment of the invention.
Figure 2:
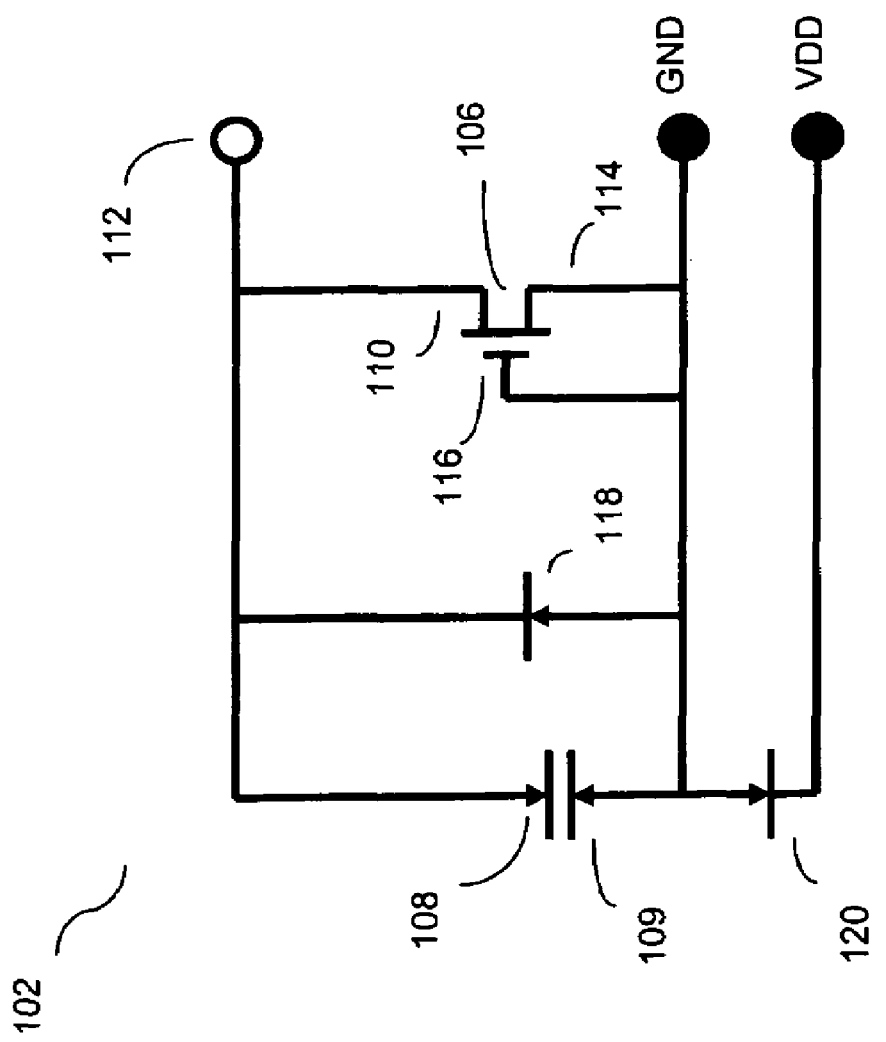
FIG. 2 illustrates a schematic view of the ESD protection circuit, in accordance with the embodiment of the invention.

FIGS. 1 and 2 present a cross-sectional view 100 and a schematic view 102, respectively, of an ESD protection circuit, in accordance with one embodiment of the present invention. The ESD protection circuit includes a grounded-gate NMOS transistor 106 and a low-capacitance SCR, which includes a first diode 108 and a second diode 109, and shares a source 114 with the NMOS transistor 106.

Referring to FIGS. 1 and 2, in the schematic view 102, the NMOS transistor 106 has a drain 110 coupled to a circuit pad 112, a source 114 and gate 116 coupled to ground, or VSS. The circuit pad 112 is further connected to a core circuitry (not shown), which is being protected by the ESD protection circuit. The first diode 108 is serially connected to the second diode 109 in an opposite direction, between the circuit pad 112 and ground. The first diode 108 is composed of a P-type contact 128 and an N well 132, in which the P-type contact 128 is disposed, as shown in the cross-sectional view 100. The second diode 109 is composed of the N well 132 and the P-type substrate, in which the N well 132 is disposed, as shown also in the cross-sectional view 100. The first diode 108 and the second diode 109 make up a bipolar transistor 136, which constructs a part of the SCR. A third diode 118 and a fourth diode 120 are coupled between the circuit pad 112 and ground, and VDD and ground, respectively, for better controlling the ESD protection circuit.

In the cross-section view 100, the parasitic equivalent SCR is shown. Both the drain 110 and the source 114 of the NMOS transistor 106 are represented by N-type doped regions. The source 114 also represents the emitter of the parasitic lateral NPN transistor 122. The gate 116, the source 114, and the P type contact 126 are all tied to VSS ground, while the drain 110, a P type contact 128, and a N type contact 130 are tied to the circuit pad 112. In addition, a N type contact 124 is connected directly to the operating voltage VDD. The P type contact 128 is formed within the N-well 132. The PN junction between the P type substrate and the drain 110 effectively forms the third diode 118, while the fourth diode 120 is formed at the PN junction between the P type substrate and the N-type contact 124. An N-well resistance 134 is formed within the N-well 132. The parasitic lateral PNP transistor 136 within the N-well 132 forms a part of the SCR needed for the proposed ESD protection circuit. While the emitter of the parasitic lateral PNP transistor 136 is connected to the P type contact 128, the base of the parasitic lateral PNP transistor 136 is connected to a N type contact 130 along with the collector of the parasitic lateral NPN transistor 122. The collector of the parasitic lateral PNP transistor 136 is also connected to the base of the parasitic lateral NPN transistor 122 as well as to the P type contact 124 through a substrate resistance 138 and the fourth diode 120. The parasitic lateral PNP transistor 136 and the parasitic lateral NPN transistor 122 construct the SCR used in the disclosed ESD protection circuit. As shown in the cross-sectional view 100, the SCR and the NMOS transistor 106 share the source 114.

The ESD protection circuit depicted in FIGS. 1 and 2 functions in two modes: the normal operation mode and the ESD mode. During the normal operation mode, source supply will apply power to VDD and VSS lines of the IC; and the voltage at the circuit pad 112 may vary between VDD and VSS. Due of the grounded gate, the NMOS transistor 106 will remain in an off position. The N-well resistance 134 and the substrate resistance 138 also ensure that the bipolar transistors 122 and 136 remain off during normal operation of the IC, leaving the output at the circuit pad 112 free to respond to normal circuit conditions. When an ESD event occurs, the incoming voltage at the circuit pad 112 will be significantly higher than VDD with respect to VSS. The NMOS transistor 106 helps to trigger on the SCR. In an ESD protection circuit, in which the NMOS transistor is properly designed, the SCR will reach the latch-up condition earlier than the NMOS transistor. As such, the SCR will bypass an ESD current from the core circuitry.

In order to better protect the core circuitry, it is desired to lower the trigger voltage of the SCR of the ESD protection circuit, such that it can respond to an ESD event earlier. As discussed above, the higher the parasitic capacitance of the ESD protection circuit, the higher the trigger voltage of the SCR. One of the major sources of the parasitic capacitance is the PN junction between the N well 132 and the P-type substrate. The interface area of the PN junction depends on the size of NMOS transistor 106. In other words, the smaller the size of the NMOS transistor 106, the smaller the interface area of the PN junction, and, therefore, the smaller the parasitic capacitance.

Conventionally, the layout of the ESD protection circuit as disclosed in FIGS. 1 and 2 inherently inhibits a design of a small NMOS transistor. In the conventional layout, the NMOS transistor is placed in a single area separated from another area, in which the first diode 108 and second diode 109 are placed. A long conductive line is required to connect the MOS transistor area and the diode area. Given that a long conductive is susceptible to non-uniformity of resistivity, the current flow through the long conductive line may vary at various locations. This would cause an undesired turning on of the NMOS transistor, before the SCR latches up. Thus, conventionally, the NMOS transistor is built bulky to withstand the current non-uniformity. However, this inevitably and undesirably keeps up the parasitic capacitance and, therefore, resulting in a high trigger voltage of the SCR.

Figure 3:
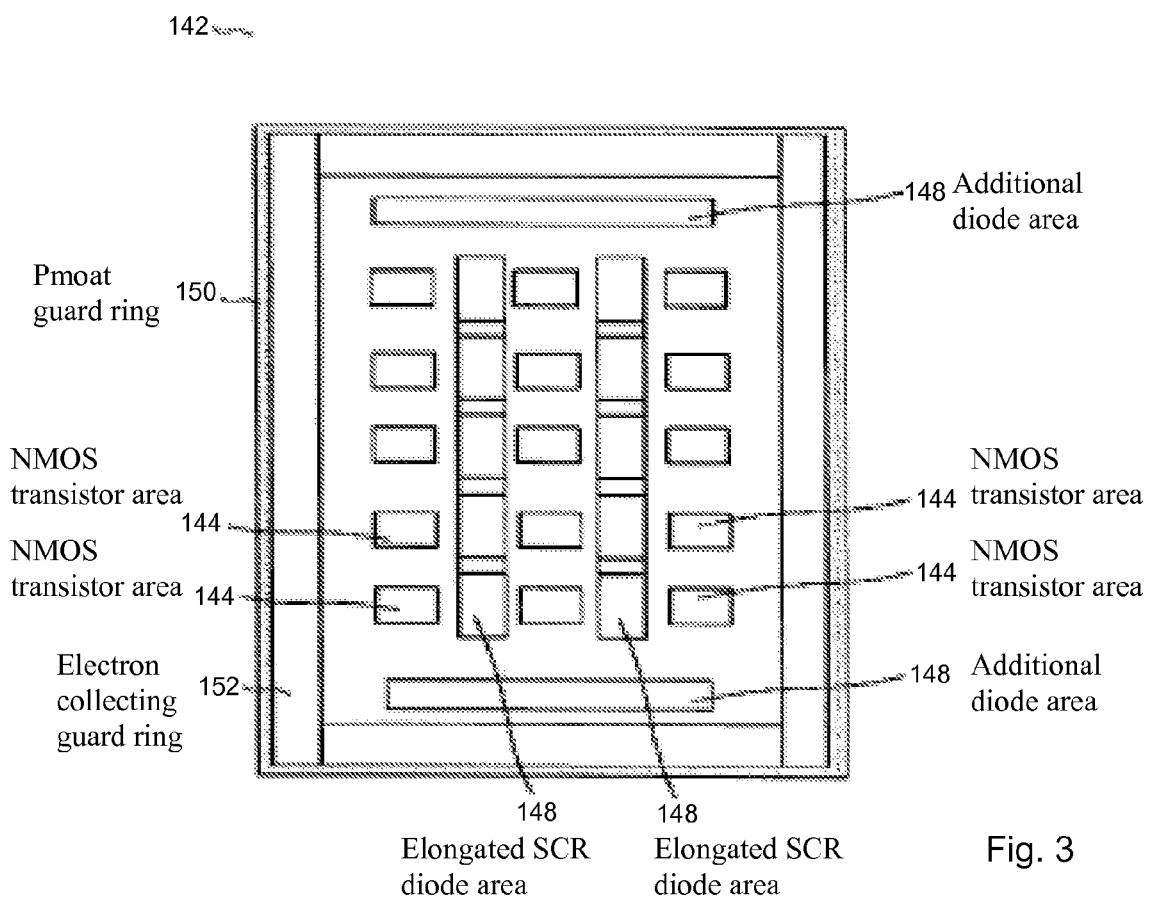
FIG. 3 illustrates a layout view of the ESD protection circuit, in accordance with the embodiment of the invention.

FIG. 3 illustrates a layout view 142 of the ESD protection circuit as shown in FIGS. 1 and 2, in accordance with one embodiment of the invention. The layout view 142 shows the placements of the components used in the ESD protection circuit. For example, the NMOS transistor 106 in FIG. 1 is placed in the NMOS transistor areas 144. Elongated SCR diode areas 146, in which the first and second diodes 108 and 109 are placed, is proximately interposed between at least two NMOS transistor areas 144. Additional diode areas 148, in which the third diode 118 is placed, are disposed at the longitudinal ends of the SCR diode areas 146. A Pmoat guard ring 150 and an electron collecting guard ring 152 surround the entire layout. The Pmoat guard ring 150 is connected to substrate potential VSS to reverse-bias the Pmoat-to-N-well junction. The electron collecting guard ring 152 is constructed from Nmoat and is connected to a positive supply VCC to help to drive the depletion region deeper into the substrate to enhance collection efficiency.

Each of the MOS transistor area 144 includes a plurality of transistors, which jointly function as the NMOS transistor 106 in FIG. 2. The MOS transistor areas 144 have substantially identical dimensions, such that each area is a modular building block of the collective, equivalent NMOS transistor 106. These areas 144 can be arranged proximate to SRC diode area 146, so that only a very short conductive line is needed to connect them together. This avoids the current non-uniformity problem in the conventional layout. As such, the total size of the NMOS transistor 106 can be made small by implementing a few of MOS transistors areas 144. This helps to reduce the parasitic capacitance and the trigger voltage of the SCR. By the same token, when more MOS transistor areas 144 are implemented, the parasitic capacitance and the trigger voltage of the SCR are higher. The physical dimension of the NMOS transistors is an important consideration since it largely determines the parasitic capacitance. In an embodiment of the invention, the width of the MOS transistor area 144, with one or more transistors, is suggested to have a range from 2 to 480 μm, with each transistor having a width from 2 to 80 μm.

In a specific embodiment of the invention, the layout view 142 has dimensions of 49 um×>μm. Each of the MOS transistor areas 144 contains 8 separate transistors, each having a width of 1.5 μm and a length of 0.22 μm. Therefore, the total dimension of each area 144 is equal to 1.5 μm×0.22 μm×8. Since there are fifteen areas 144, there is a total of 120 transistors within the layout view 142, with a total transistor area of 1.5 μm×0.22 μm×120. Each of the two SCR diode areas 146 formed between the areas 144 contains 5 segments (1.3 μm×5 μm) of materials that construct the PN junction diodes 108 and the NP junction diodes 109, which form parts of the SCR, while the additional diode area 148 (2 um×12 um) forms the PN junction diode 118, as shown in FIG. 1.

Figure 4:
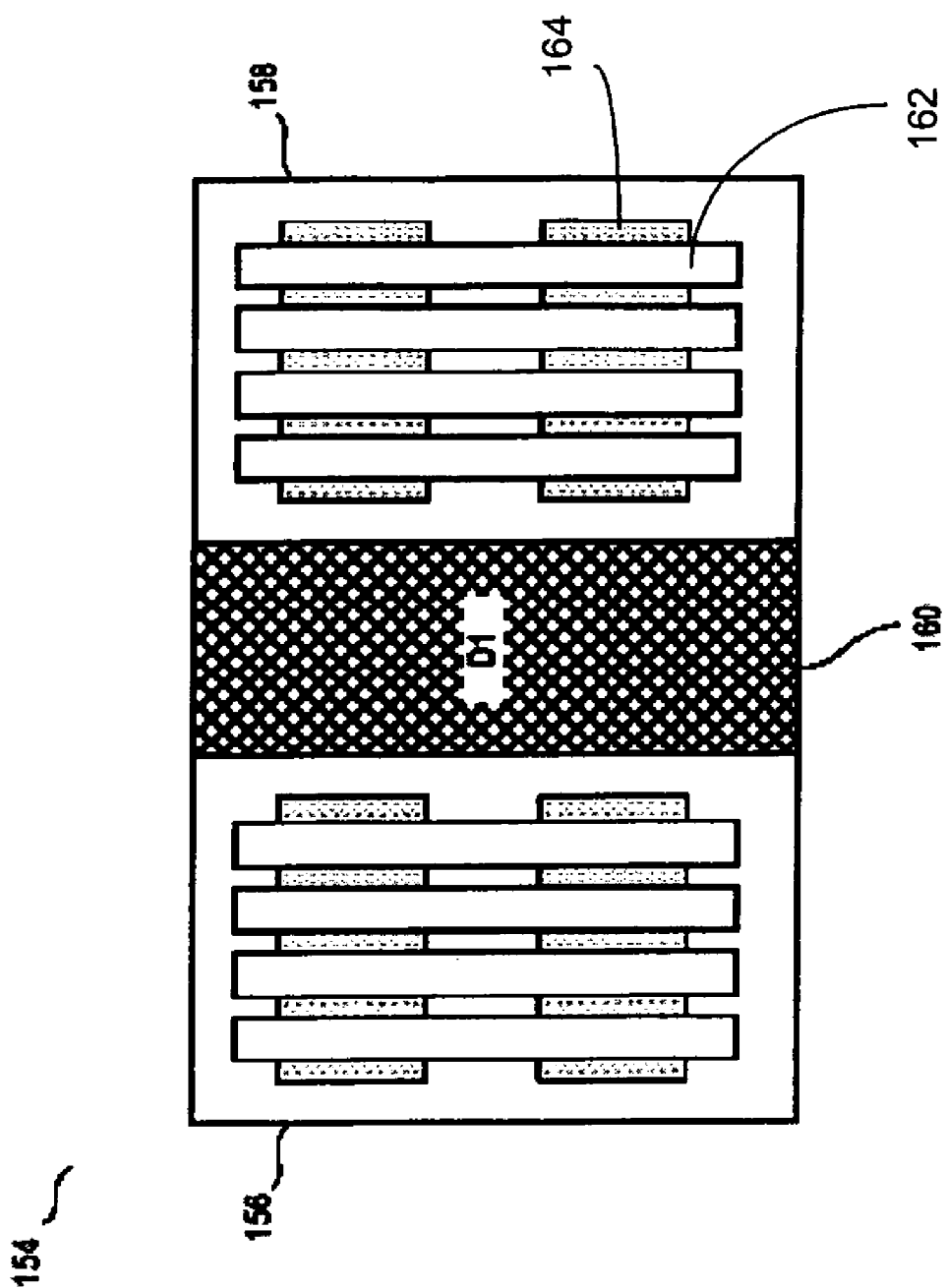
FIG. 4 illustrates a partially enlarged layout view of the ESD protection circuit, in accordance with the embodiment of the invention.

FIG. 4 illustrates a detailed layout view 154 of a unit of SCR that contains two MOS transistor areas 144 and an elongated SCR diode area 146 as presented earlier in FIG. 3. The layout view 154 provides a detailed view of the layout view 142 to further demonstrate how NMOS transistors are integrated with the SCR. The two areas 144 from FIG. 3 are represented by areas 156 and 158, while a segment of the elongated area 146 is represented by a segment 160. Each of the areas 156 and 158 contains a set of 8 NMOS transistors, formed by gates 162 and source/drain regions 164. Each NMOS transistor within the areas 156 and 158 has a width of 1.5 μm and a length of 0.22 μm. Since there are 16 NMOS transistors, the total area of NMOS transistors in the layout view 154 is 1.5 μm×0.22 μm×16. The segment 160 with a dimension of 1.3 μm×5 μm contains a PN junction diode D1 that forms a part of the SCR.

The following table shows trigger voltage response results, in accordance with one embodiment of the present invention.

|  |  | NMOS (3 × 36 um) | NMOS (4 × 36 um) | NMOS (5 × 36 μm) |
| --- | --- | --- | --- | --- |
| (+) vs. VSS | HBM | 3.25 KV | 4.5 KV | 5.75 KV |
|  | IT2 | 1.93 A | 2.53 A | 3.14 A |
| (+) vs. VDD | HBM | 5.5 KV | 7 KV | 7.75 KV |
|  | IT2 | 2.8 A | 3.68 A | 4.55 A |

The response results were gathered from human body model tests that were preformed on ESD protection circuits with different NMOS transistor sizes. ESD tests were performed on ESD protection circuits including different NMOS transistor sizes with both positive and negative sources. The different sizes of the three ESD protection transistors are 108 um, 144 um, and 180 um. The table shows the highest voltage and drain current that can occur at those transistors. It also shows that the smaller size of the NMOS transistor helps to reduce the trigger voltage.

By implementing various numbers of the NMOS transistor areas, the parasitic capacitance in the ESD protection circuit is reduced, and a lower trigger voltage can be achieved. This improvement speeds up the turn-on process for the SCR of the ESD protection circuit, thereby allowing it to turn on much earlier to protect the core circuitry of the IC. The low parasitic capacitance allows the ESD protection circuit to be applicable in fields that demand the use of high frequencies, such as radio frequency (RF) applications. The novel SCR structure used in this invention helps to create a very low parasitic capacitance for such applications, since it is created from the junction of N-well and P type substrate. Low-capacitance SCR can trigger much sooner during an ESD event.

The above illustrations provide many different embodiments for implementing different features of this invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrostatic discharge (ESD) protection circuit comprising:
   a silicon controlled rectifier (SCR) coupled between a circuit pad and ground for bypassing an ESD current from the circuit pad during an ESD event; and
   at least one grounded-gate MOS transistor, having a source shared with the silicon controlled rectifier, coupled between the circuit pad and ground for reducing a trigger voltage of the silicon controlled rectifier during the ESD event,
   wherein the silicon controlled rectifier includes a first parasitic diode formed between a P-type doped region and an N-well and a second parasitic diode formed between an N-type doped region and a P-type substrate, wherein both the P-type and N-type doped regions are formed within the N-well and the first and the second diodes are connected in an opposite direction, between the circuit pad and the shared source of the MOS transistor, for functioning as a bipolar transistor,
   wherein in a layout view, a first area for placement of the first and second parasitic diodes is interposed between at least two sets of grounded-gate MOS transistor areas having a plurality of transistors jointly functioning as the MOS transistor, disposed proximately at two sides of the first area to reduce a trigger voltage of the SCR.

2. The ESD protection circuit of claim 1 wherein the MOS transistor areas have substantially identical dimensions.

3. The ESD protection circuit of claim 2 wherein each of the MOS transistor areas have a width ranging from 2 to 480 pm.

4. The ESD protection circuit of claim 1 further comprising a third diode, coupled between the circuit pad and ground, wherein the layout view of the ESD protection circuit has a third area disposed at a longitudinal end of the first area for placement of the third diode.

5. The ESD protection circuit of claim 1 further comprising a first guard ring connected to a positive voltage and a second guard ring connected to ground, surrounding the first area and the second areas.

6. An integrated circuit (IC) having an electrostatic discharge (ESD) protection circuit, the IC comprising:
   a silicon controlled rectifier (SCR) diode area for placement of a first diode and a second diode, which are serially connected with one another in an opposite direction, for serving as a bipolar transistor that, in part, constructs the SCR, wherein the SCR diode area includes a first parasitic diode formed between a P-type doped region and an N-well and a second parasitic diode formed between an N-type doped region and a P-type substrate, both P-type and N-type doped regions being formed within the N-well; and at least two sets of grounded-gate MOS transistor areas, having a plurality of transistors jointly functioning as the MOS transistor, disposed proximately at two sides of the SCR diode area to reduce a trigger voltage of the SCR and a parasitic capacitance of the ESD protection circuit.

7. The IC of claim 6 wherein the MOS transistor areas have substantially identical dimensions.

8. The IC of claim 6 wherein the MOS transistor areas have substantially identical dimensions.

9. The IC of claim 6 wherein the trigger voltage of the SCR decreases as a number of the MOS transistor areas decreases.

10. The IC of claim 6 further comprising at least one additional diode area disposed at a longitudinal end of the SCR diode area.

11. The IC of claim 6 further comprising a first guard ring area connected to a positive voltage, surrounding the SCR diode area and the MOS transistor area.

12. The IC of claim 6 further comprising a second guard ring connected to ground, surrounding the SCR diode and the MOS transistor areas.

13. An integrated circuit (IC) layout for an electrostatic discharge (ESD) protection circuit having a silicon controlled rectifier (SCR) for by passing an ESD current from a core circuitry during an ESD event, and a grounded-gate MOS transistor for reducing a trigger voltage of the silicon controlled rectifier during the ESD event, the IC layout comprising:

an SCR diode area for placement of a first diode and a second diode, which are serially connected with one another in an opposite direction, for serving as a bipolar transistor that, in part, constructs the SCR, wherein the SCR diode area includes a first parasitic diode formed between a P-type doped region and an N-well and a second parasitic diode formed between an N-type doped region and a P-type substrate, both P-type and N-type doped regions being formed within the N-well; and at least two sets of MOS transistor areas, having a plurality of transistors jointly functioning as the MOS transistor, disposed proximately at two sides of the SCR diode area to reduce a trigger voltage of the SCR and a parasitic capacitance of the ESD protection circuit, wherein the MOS transistor areas have substantially identical width ranging from 2 to 480 pm.

14. The IC layout of claim 13 wherein the trigger voltage of the SCR decreases as a number of the MOS transistor areas decreases.

15. The IC layout of claim 13 further comprising at least one additional diode area disposed at a longitudinal end of the SCR diode area.

16. The IC layout of claim 13 further comprising a first guard ring area connected to a positive voltage, surrounding the SCR diode area and the MOS transistor area.

17. The IC layout of claim 13 further comprising a second guard ring connected to ground, surrounding the SCR diode area and the MOS transistor areas.

* * * * *